US006570083B2

(12) United States Patent
Gravisse et al.

(10) Patent No.: US 6,570,083 B2
(45) Date of Patent: May 27, 2003

(54) PHOTOVOLTAIC GENERATORS WITH LIGHT CASCADE AND VARYING ELECTROMAGNETIC FLUX

(75) Inventors: Philippe Gravisse, Paris (FR); Gilles Destremau, Paris (FR); Marc Schiffmann, Juvisy (FR)

(73) Assignee: Biocure S.A.R.L. (FR)

( * ) Notice: Subject to any disclaimer, the term of this patent is extended or adjusted under 35 U.S.C. 154(b) by 0 days.

(21) Appl. No.: 09/968,274

(22) Filed: Oct. 1, 2001

(65) Prior Publication Data

US 2002/0074035 A1 Jun. 20, 2002

Related U.S. Application Data

(63) Continuation of application No. PCT/FR00/01027, filed on Apr. 19, 2000.

(30) Foreign Application Priority Data

Apr. 19, 1999 (FR) .............................. 99 04914
May 12, 1999 (FR) .............................. 99 06113

(51) Int. Cl.[7] .............................................. H01L 31/055
(52) U.S. Cl. .................... 136/246; 136/247; 136/259; 136/291; 257/432; 257/435; 257/436; 257/438; 257/439
(58) Field of Search ................................ 136/246, 247, 136/259, 291; 257/432, 435, 436, 438, 439

(56) References Cited

U.S. PATENT DOCUMENTS 3,912,931 A * 10/1975 Gravisse et al. ......... 250/458.1
4,088,508 A * 5/1978 Gravisse ..................... 136/257
4,324,946 A * 4/1982 Gravisse ..................... 136/247

FOREIGN PATENT DOCUMENTS

| DE | 26 20 115 A1 | 11/1977 |
| DE | 27 37 847 A1 | 3/1979 |
| DE | 29 26 191 A1 | 1/1980 |
| EP | 0 735 596 A1 | 10/1996 |
| FR | 2 697 352 A1 | 4/1994 |
| FR | 2697352 A1 * | 4/1994 |
| FR | 2792460 A1 * | 10/2000 |
| WO | WO-00/79339 A1 * | 12/2000 |

OTHER PUBLICATIONS

Patent Abstracts of Japan, abstract for JP 63–82326, Apr. 1988.

* cited by examiner

*Primary Examiner*—Alan Diamond
(74) *Attorney, Agent, or Firm*—Piper Rudnick LLP

(57) ABSTRACT

A photovoltaic generator including at least one photovoltaic cell, and a transparent matrix placed with at least one optically active material with an absorption wavelength $\lambda a$ and a reemission wavelength $\lambda r$, the optically active material selected such that $\lambda a$ corresponds to a range of the photovoltaic cell with a lower sensitivity than $\lambda r$, the matrix having an input surface and an opposite surface and comprises a reflecting coating an a dichroic filter on the input surface that substantially reflects wavelengths longer than about 950 nm and is substantially transparent for wavelengths less than about 950 nm, and on the opposite surface the matrix has a reflecting coating that reflects wavelengths greater than about 400 nm, and wherein the photovoltaic cell is included in the matrix.

9 Claims, 1 Drawing Sheet

Solar Flow

Solar Flow

US 6,570,083 B2

PHOTOVOLTAIC GENERATORS WITH LIGHT CASCADE AND VARYING ELECTROMAGNETIC FLUX

RELATED APPLICATION

This is a continuation of International Application No. PCT/FR00/01027, with an international filing date of Apr. 19, 2000, which is based on French Patent Application No. 99/04914, filed Apr. 19, 1999, and French Patent Application No. 99/06113, filed May 12, 1999.

FIELD OF THE INVENTION

This invention relates to the field of photovoltaic conversion.

BACKGROUND

Electricity generators comprising photovoltaic cells are known in the state of the art. These cells are composed of semi-conducting barriers that output an electric signal that depends on the light intensity illuminating their surface. Various works have been done to improve the efficiency of this type of cell.

A first series of work applies to improvements to the cells themselves, for example, by the production of monocrystalline cells. These improvements result in cells with an extremely high manufacturing cost.

Another series of work has been done to improve cell illumination conditions, particularly by techniques to convert the solar spectrum to optimally adapt light radiation acting on the cells, to the sensitivity curve of these cells.

For example, U.S. Pat. NO. 4,110,123 discloses an example photovoltaic conversion device comprising a support doped with fluorescent materials.

U.S. Pat. No. 5,813,238 also discloses a solar sensor presenting durable fluorescent properties comprising a polymer matrix, a coloring agent and a stabilizer. The polymer matrix is composed of polycarbonate and the coloring agent is chosen among the group comprising essentially thioxanthobe, perylene imide and/or compounds of thioindigoid. This patent also proposes to position reflecting elements such that collected sunlight can be aimed at a solar cell.

U.S. Pat. No. 4,367,367 describes a collector suitable for concentrating solar energy on a photoelectric cell comprising at least one fluorescent doping agent. The cell is fixed on one edge of the collector which is coated with a reflecting coating.

U.S. Pat. No. 4,395,582 also describes a solar converter comprising a substrate doped with photo-active combinations called "light cascades" to improve the quality of the light spectrum illuminating the photoelectric cells.

Accordingly, it would be advantageous to provide an improved, compact, high efficiency photovoltaic generator.

SUMMARY OF THE INVENTION

This invention relates to a photovoltaic generator including at least one photovoltaic cell, and a transparent matrix placed with at least one optically active material with an absorption wavelength $\lambda a$ and a reemission wavelength $\lambda r$, the optically active material selected such that $\lambda a$ corresponds to a range of the photovoltaic cell with a lower sensitivity than $\lambda r$, the matrix having an input surface and an opposite surface and comprises a reflecting coating and a dichroic filter on the input surface that substantially reflects wavelengths longer than about 950 nm and is substantially transparent for wavelengths less than about 950 nm, and on the opposite surface the matrix has a reflecting coating that reflects wavelengths greater than about 400 nm, and wherein the photovoltaic cell is included in the matrix.

BRIEF DESCRIPTION OF THE DRAWING

The invention will be better understood after reading the following description with reference to the attached drawing in which:

the single FIGURE shows a perspective view of a second example embodiment.

DETAILED DESCRIPTION

Figure 1:
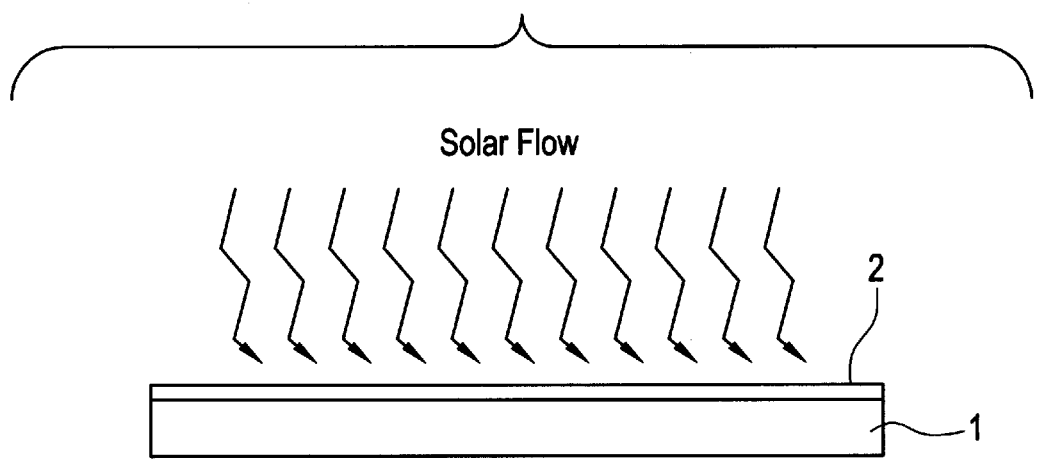
Figure 1:
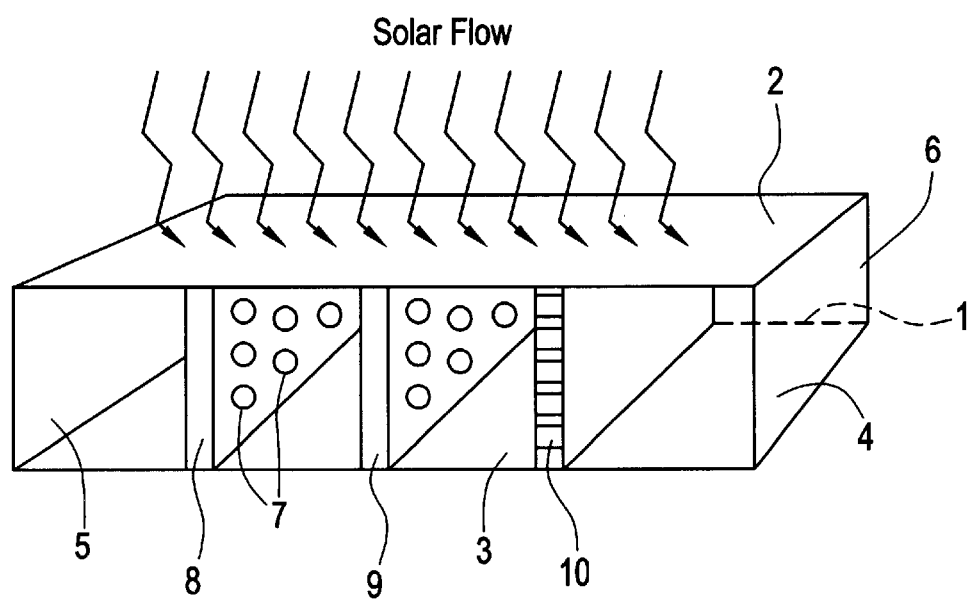

It will be appreciated that the following description is intended to refer to specific embodiments of the invention selected for illustration in the drawings and is not intended to define or limit the invention, other than in the appended claims.

In its most general embodiment, the invention relates to a photovoltaic generator comprising at least one photovoltaic cell and a transparent matrix placed with at least one optically active material with an absorption wavelength $\lambda a$ and a reemission wavelength $\lambda r$, the optically active material being chosen such that $\lambda a$ corresponds to a range of the photovoltaic cell with lower sensitivity than $\lambda r$, the matrix comprising a reflecting coating, characterized in that the matrix has a dichroic filter on its input surface area that substantially reflects wavelengths longer than about 950 nm and is substantially transparent for wavelengths less than about 950 nm, and on the surface opposite the input surface, it has a reflecting coating that reflects wavelengths greater than about 400 nm, the photovoltaic cell being included in the transparent matrix.

Advantageously, the matrix is formed by a strip of methyl polymethacrylate doped with light cascades.

Preferably, the matrix input surface area is coated with an interference layer with a maximum transmission ratio for wavelengths between about 330 and about 900 nm, and a maximum reflection ratio for wavelengths longer than about 950 nm.

According to one preferred embodiment, the surface opposite the matrix input surface area is coated with a diffusing reflecting layer with a maximum reflection ratio for wavelengths between about 300 and about 600 nm, a high absorption ratio for wavelengths on the order of about 600 nm and a large diffusion ratio for wavelengths of about 950 nm.

According to one particular embodiment, the sides of the matrix are coated with a reflecting coat.

According to one preferred embodiment, the generator according to the invention comprises several photovoltaic cells laid out on planes approximately perpendicular to the input surface.

Turning now to the drawing, the single FIGURE represents a cross-sectional view of a generator according to the invention. It is composed of a parallelepiped-shaped block (1) forming a matrix made of transparent polymethylmethacrylate (PMMA). This matrix (1) is doped with "light cascades," a term that denotes compositions combining several optically active materials with a large offset between the absorption wavelength and the reemission wavelength. The main purpose of these light cascades is to absorb wavelengths with low sensitivity ranges of the photovoltaic cells and with high solar spectrum energy, and to shift the energy towards wavelengths corresponding to high sensitivity ranges of the photovoltaic cells.

For example, absorption takes place at between about 360 and about 600 nm and reemission takes place at about 600 nm.

The input surface area (2) to the matrix is coated with a dichroic interference filter reflecting wavelength radiation longer than about 950 nm and transparent for wavelengths between about 330 nm and about 900 nm.

The opposite surface (3) and the side faces (4, 5, 6) are coated with a white reflector with an absorption peak at about 600 nm and a reemission peak at about 950 nm.

The matrix (1) also comprises several photovoltaic cells (7) located in planes (8 to 10) perpendicular to the input surface area (2).

The cells are encapsulated in the matrix at the time that they are made. This configuration increases the efficiency of the generator by a factor of about 11 compared with a generator according to the state of the art with an identical input surface area.

The ratio between the input surface area S1 and the total surface area S2 of the photovoltaic cells is on the order of about 100.

According to one variant, the cells are glued on some side faces of the parallelepiped-shaped block.

It may also be advantageous to incorporate an anti-stoke doping agent in the coating on the face opposite the illumination surface, to pump light in the 1.4 to 1.6 micrometer spectral band, and reemit it in the visible for example between about 550 and about 660 nanometers. For example, this doping agent may be a rate earth, particularly a rate earth oxysulfide, and more particularly the product marketed under the "LUMILUX Green UCZ" trade name, or the "LUMILUX IR CD 142" product made by the RIEDEL de HAËN Company.

The invention is described above as a non-limitative example.

What is claimed is:

1. A photovoltaic generator comprising:
   a matrix comprising at least one optically active material with an absorption wavelength $\lambda a$ and a reemission wavelength $\lambda r$,
   at least one photovoltaic cell within said matrix, wherein said optically active material is selected such that $\lambda a$ corresponds to a range of said photovoltaic cell with a lower sensitivity than $\lambda r$,
   a dichroic filter on an input surface of said matrix that substantially reflects wavelengths longer than about 950 nm and is substantially transparent for wavelengths less than about 950 nm, and
   a diffusing reflecting coating on an opposite surface of said matrix with a maximum reflection ratio for wavelengths between about 300 and about 600 nm, an absorption ratio for wavelengths of about 600 nm and a diffusion ratio for wavelengths of about 950 nm.

2. The photovoltaic generator according to claim 1, wherein the matrix is formed by a strip of polymethylmethacrylate doped with light cascades.

3. The photovoltaic generator according to claim 1, wherein said input surface is coated with an interference layer with a maximum transmission ratio for wavelengths between about 330 and about 900 nm, and a maximum reflection ratio for wavelengths longer than about 950 nm.

4. The photovoltaic generator according to claim 2, wherein said input surface is coated with an interference layer with a maximum transmission ratio for wavelengths between about 330 and about 900 nm, and a maximum reflection ratio for wavelengths longer than about 950 nm.

5. The photovoltaic generator according to claim 1, wherein said matrix has sides coated with a reflecting coat.

6. The photovoltaic generator according to claim 1, further comprising a plurality photovoltaic cells laid out on planes approximately perpendicular to said input surface.

7. The photovoltaic generator according to claim 6, wherein a ratio between an area S1 of said input surface and a total surface area S2 of said photovoltaic cells is about 100.

8. The photovoltaic generator according to claim 1, wherein said opposite surface is coated by an anti-stoke doping agent so that light can be pumped within a 1.4 to 1.6 micrometer spectral band and reemitted in the visible spectrum.

9. The photovoltaic generator according to claim 8, wherein the visible spectrum is between about 550 and about 660 nanometers.

* * * * *